United States Patent [19]
Alini et al.

[11] Patent Number: 5,495,166
[45] Date of Patent: Feb. 27, 1996

[54] MOS TRANSISTOR THRESHOLD VOLTAGE GENERATOR

[75] Inventors: Roberto Alini, Stradella; Andrea Baschirotto, Tortona; Rinaldo Castello, Arcore; Salvatore Portaluri, Pavia, all of Italy

[73] Assignee: SGS-Thmonson Microelectronics s.r.l., Milano, Italy

[21] Appl. No.: 45,465

[22] Filed: Apr. 8, 1993

[30] Foreign Application Priority Data

Apr. 16, 1992 [EP] European Pat. Off. ............. 92830187

[51] Int. Cl.$^6$ ...................................................... G05F 3/16
[52] U.S. Cl. ......................................... 323/314; 323/316
[58] Field of Search ................................. 323/274, 276, 323/281, 312, 313, 314, 315, 316

[56] References Cited

U.S. PATENT DOCUMENTS

| | | | |
|---|---|---|---|
| 3,777,235 | 12/1973 | Lahti | 318/341 |
| 4,531,699 | 8/1985 | Baker | 323/276 |
| 4,837,459 | 6/1989 | Bukowski et al. | 323/315 X |
| 4,897,596 | 1/1990 | Hughes et al. | 323/315 |
| 5,077,518 | 12/1991 | Han | 323/313 X |
| 5,159,260 | 10/1992 | Yoh et al. | 323/313 |

FOREIGN PATENT DOCUMENTS 2016801  3/1979 United Kingdom.
2198559 12/1986 United Kingdom.

OTHER PUBLICATIONS

Kearney, "FET Threshold Voltage Dependent Current Generator," *Research Disclosure*, No. 281, New York, NY, Sep. 1987, No. 281, p. 570.

Moriarty, "FET Threshold Voltage Generator," *Research Disclosure*, No. 281, New York, N.Y. Sep. 1987, p. 572.

"Silicon Band–Gap Reference Voltage Generators Based on Dual Polysilicon MOS Transistors," *IBM Technical Disclosure Bulletin*, vol. 32, No. 9B, Armonk, N.Y., Feb. 1990, pp. 4–5.

Tsividis & Ulmer, "Threshold voltage generation and supply–independent biasing in c.m.o.s. integrated circuits," *Electronic Circuits and Systems*, vol. 3, No. 1, Jan. 1979, pp. 1–4.

*Primary Examiner*—Peter S. Wong
*Assistant Examiner*—Y. J. Han
*Attorney, Agent, or Firm*—David V. Carlson; Clarence T. Tegreene; Seed and Berry

[57] ABSTRACT

A threshold voltage generator for a field-effect transistor, being of a type adapted to compensate for variations of the threshold voltage from a nominal value, comprising a first amplifier having a first input connected to a current generator; a second amplifier connected ahead of a second input of the first amplifier and having an input connected to another current generator; and a third amplifier connected after the first amplifier and having an output adapted to produce the value of said threshold voltage.

16 Claims, 3 Drawing Sheets

MOS TRANSISTOR THRESHOLD VOLTAGE GENERATOR

FIELD OF THE INVENTION

This invention relates to a threshold voltage generator for a field-effect transistor. More particularly, the invention concerns a threshold voltage generator for a MOS transistor, which is effective to compensate for variations in the threshold voltage from a nominal value.

BACKGROUND OF THE INVENTION

As is well known, threshold voltage Vth is the voltage that must be applied across the gate and source electrodes of a MOS transistor in order to have a current flow through the transistor.

This voltage is, therefore., a parameter of primary importance to the control of the operation of integrated circuits made in accordance either with the CMOS or mixed bipolar-MOS (BiMOS) technologies.

The nominal value of the threshold voltage is set by the technological process, but this value does not remain constant over time due to a number of factors, among which are: variations in some parameters of the manufacturing process; operating temperature; and aging of the integrated circuit. These factors bring about changes which are difficult to foresee, with variations of up to 40% in the value of the threshold voltage Vth with respect to the nominal value.

To obviate this problem, the prior art has proposed a circuit approach described by Y. P. Tsividis and R. W. Ulmer in an article "Threshold voltage generation and supply-independent biasing in CMOS integrated circuits," *Electronic Circuits and Systems* Vol. 3, No. 1, January 1979.

That approach provides a circuit device capable of generating a voltage with a value which is an integer multiple of the threshold voltage Vth, to thereby provide an independent supply source having a desired value and adapted for use as a reference voltage to attenuate the effects from the threshold voltage variability.

While being in many ways advantageous, this prior approach falls short of solving all the problems involved in making typical integrated circuits.

Specifically, the circuit proposed by the prior art has shown serious accuracy limitations where called upon to generate threshold voltages below 0.4 volts. Further, it has been impossible to detect threshold voltages of n-channel MOS transistors made with processes of the so-called P-well type, i.e., doping processes wherein pockets of the P-well type are formed in the substrate of the semiconductor.

Likewise, the prior art circuit is unable to detect threshold voltages of p-channel MOS devices obtained with processes of the N-well type.

SUMMARY OF THE INVENTION

The technical advantages of this invention is to provide a threshold voltage generating circuit, particularly for MOS transistors, which has such structural and performance characteristics as to overcome the drawbacks with which the above prior approach is beset.

This advantage is obtained by using a voltage generator of the type described and claimed herein.

The features and advantages of a threshold voltage generator according to the invention will become apparent from the following detailed description of an embodiment thereof, given by way of non-limitative example with reference to the accompanying drawings.

DETAILED DESCRIPTION OF THE INVENTION

Figure 1:
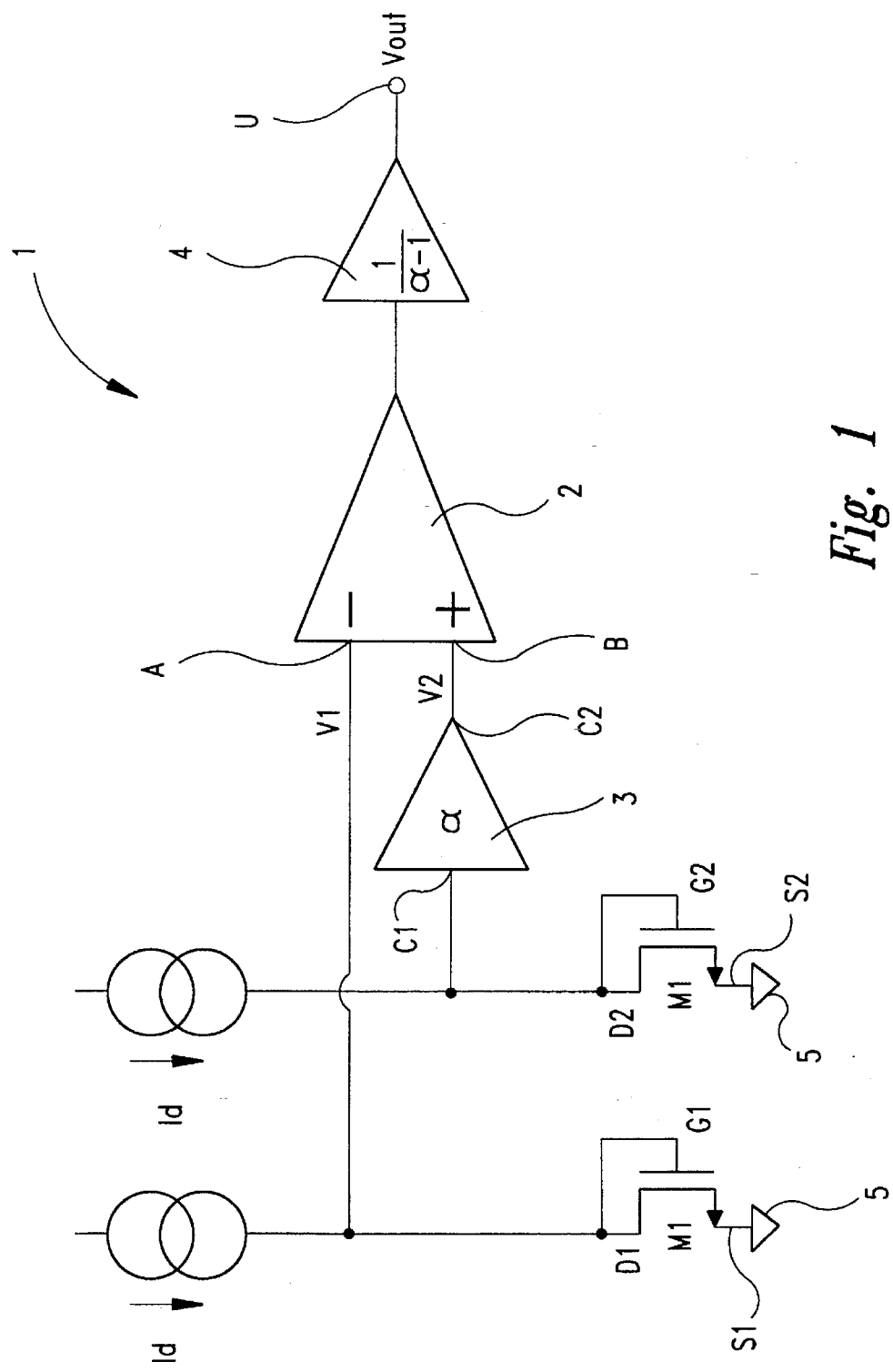
FIG. 1 is a diagrammatic view of a voltage generator according to the invention.
Figure 2:
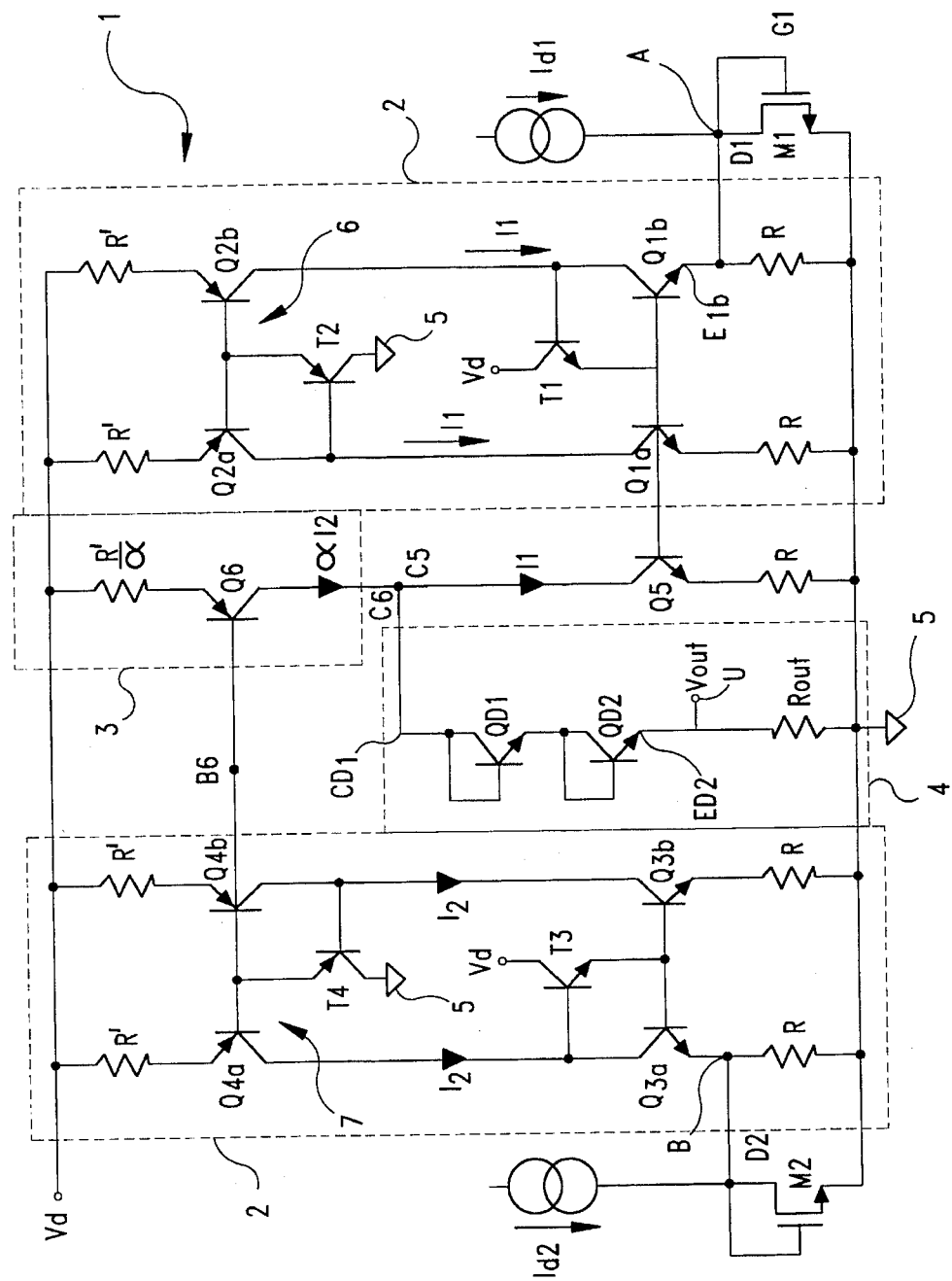
FIG. 2 is a diagram showing the generator of FIG. 1 in greater detail.
Figure 3:
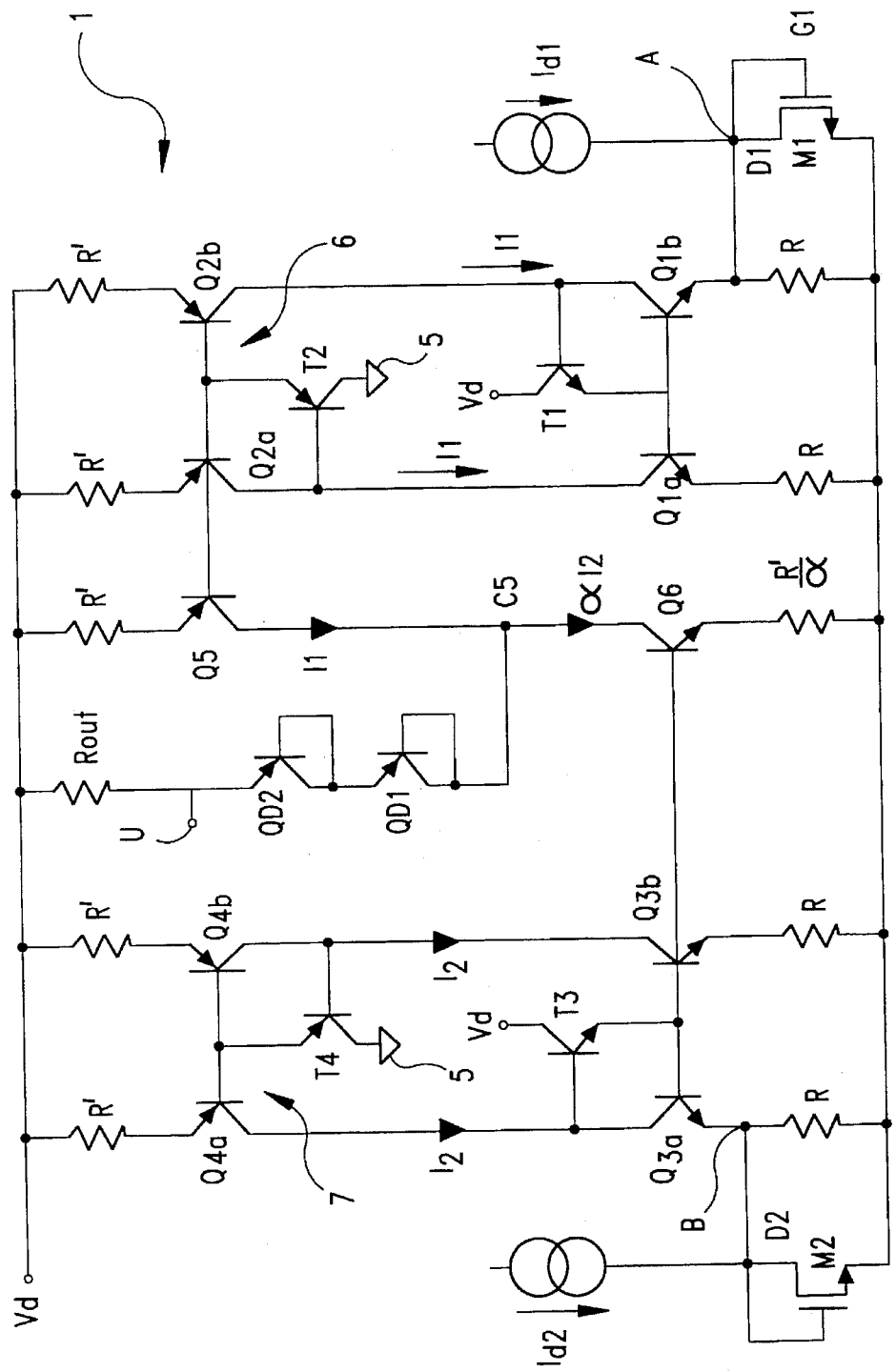
FIG. 3 is a further diagram showing a modified embodiment of the generator of FIG. 1.

With reference to FIGS. 1–3, generally and schematically shown at 1 is a generator 1 of threshold voltage Vth, labelled Vout in FIG. 1, embodying this invention and intended for supplying the gate electrode G (not shown) of a transistor M (not shown) of the MOS type.

This generator 1 comprises a first differential amplifier 2 having two inputs A and B and being of the differential cell type, for example. The first input A, also referred to as the inverting input A, is connected electrically to a current generator Id1, and to a drain electrode D1 of a MOS transistor M1. This transistor M1 has its source S1 connected to a reference potential 5, typically device ground, and its gate electrode G1 connected to the drain D1.

Basically, the inverting input A of the amplifier 2 is connected to the reference potential through the transistor M1 into a diode configuration.

The second input B of the amplifier 2, referred to as the non-inverting input B, is connected to an output C2 of a voltage amplifier 3 having a gain value defined by a parameter $\alpha$.

This second-mentioned amplifier 3 has an input C1 connected both to a second current generator Id2 and to the reference potential 5 via a MOS transistor M2, which is connected in the circuit into a diode configuration and has its gate G2 and drain D2 in common and its source S2 connected to said reference potential 5.

The generator 1 layout is completed by a third amplifier 4 connected downstream from the first-mentioned amplifier 2 and being characterized by a gain expressed by the $1/(\alpha-1)$ ratio.

Detailed in FIG. 2 is one embodiment of the generator 1 circuit. The corresponding elements of FIG. 1 are shown in boxes outlined in dotted form in FIG. 2, bearing the same reference numbers.

The differential amplifier 2 is structured with a first cell comprising bipolar transistors Q1a, Q1b connected in a common-base link and, via a transistor T1, to a constant reference voltage Vd.

The emitter $E1_b$ of transistor Q1b is indicated at A because it would coincide with the inverting input of stage 2. Connected to the input A are the drain electrode D1 of the MOS transistor M1 configured as previously described, and the corresponding current generator Id1.

The differential amplifier 2 also includes transistors Q2a and Q2b which make up, in combination with another transistor T2, a biasing circuit 6 configured as a current mirror each of transistor Q2a and Q2b supplying a current I1 to each of transistors Q1a and Q1b, respectively.

Arranged in parallel with the first-mentioned transistor pair Q1a, Q1b is a bipolar transistor Q5 of the npn type having the emitter connected to the potential 5 via a resistor R and the collector C5 in common with the collector C6 of a transistor Q6 of the pnp type. The transistor Q6 corresponds generally to the second amplifier 3 of the layout shown in FIG. 1 and has its emitter connected to the reference voltage Vd via a resistor having a resistive value of R/α.

A second cell comprises a pair of bipolar transistors Q3a, Q3b connected with their bases in common. A further transistor T3 connects these bases to the reference voltage Yd.

The emitter B, of the transistor Q3a represents the non-inverting input B of stage 2. Connected to this input B are the drain D2 of the MOS transistor M2 and the other generator Id2 equal to Id1. Because the function of amplifier 3 is realized by the configuration of transistor Q6 and biasing resistor R/α connected at the output of the second cell, a separate amplifier as shown by the second amplifier 3 of FIG. 1 is not required between non-inverting input B of amplifier 2 and the interconnected gate/drain D2 of MOS transistor M2 and current-source Id1.

A current-mirror biasing circuit 7 comprises transistors Q4a, Q4b and T4 connected to the pair Q3a, Q3b as in circuit 6. The bases of transistors Q4a, Q4b are connected in common and to the base B6 of transistor Q6. Additionally, the area of transistor Q6 is α times as large as that of transistor Q4a.

The circuit 1 structure is completed by a pair of transistors QD1 and QD2 of the bipolar npn type which are connected serially to each other and in a diode configuration. These serve the function of ensuring an adequate collector-emitter voltage drop across transistor Q5.

The former, QD1, of these transistors has its collector CD1 in common with the collectors C5 and C6 of transistors Q5 and Q6, whilst the emitter ED2 of the latter, QD2, transistor is connected to the reference potential 5 via a resistor Rout.

This emitter ED2 also constitutes the output U for the circuit 1 where the voltage value Vout, corresponding to the desired threshold voltage Vth, becomes available.

In this configuration, a ground-referenced threshold voltage is generated, but nothing forbids said threshold voltage from being referenced to the value of the supply voltage Vd. Reference to supply voltage Vd can be accomplished simply by using pnp transistors for the transistor-diodes QD1, QD2 and by connecting in series the replacement pnp output resistor Rout between the output U and the supply Vd rather than reference potential 5. This alternative embodiment is shown in FIG. 3. Note that the locations of transistor/resistor pairs Q5/R and Q6/(R/α) are interchanged.

The operation of the inventive generator 1 will now be described.

Designated $V_{ov}$, the overdrive voltage, is herebelow the difference between the gate-source voltage drop $V_{gs}$ across the MOS transistors M1, M2 and the threshold voltage Vth of the respective transistors M1, M2, shown mathematically as $$V_{ov}=(V_{gs}-V_{th}).$$

The current flowing through a MOS transistor operated in the saturation range is given by the relation:

$$Io=[\mu_o\ C_{ox}/(1+Q\ V_{ov})](W/L)V_{ov}^2(1+K\ V_{DS}) \quad (1)$$

where, $\mu_o$, $C_{ox}$ are terms for certain characteristic parameters known in the art for MOS transistors, W and L are the width and length of the channel region, Q is a parameter accounting for the mobility of the charge carriers, and K accounts for channel length modulation, the two last-mentioned parameters being second-order effects.

The instance of K=Q=0 will be considered first.

Defining $\alpha_o$ based on the relation between the ratio (W/L) of each of transistors M1 and M2, namely by:

$$(W/L)_2=\alpha_o^2(W/L)_1 \quad (2)$$

where $(W/L)_2$ is the width/length ratio of transistor 2 and $(W/L)_1$ is the width/length ratio of transistor 1, and $\alpha_o$ is, for example, in the range of 1.5–2.

The currents flowing through transistors M1 and M2 are the same and entirely due to the contribution from each corresponding generator Id1 and Id2. By virtue of the circuit networks composed of transistors Q1a, Q1b; Q2a, Q2b; Q3a, Q3b; Q4a, Q4b; no current will enter the circuit nodes A and B.

Accordingly, the relation between the overdrive voltages $Vov_1$ and $Vov_2$ respectively of the two transistors M1, M2 may be expressed as follows from equations (1) and (2) with Io=Id1=Id2:

$$Vov_1=\alpha_o Vov_2 \quad (3)$$

and, noting that $V_2=V_{gs2}$ and $V_1=V_{gs1}$ where $V_{gs1}$ and $V_{gs2}$ are the gate-source voltage of transistors M1, M2 respectively, the input to amplifier 2 of FIG. 1 is, $$V_2-V_1=\alpha(Vov_2+Vth)-(Vov_1+Vth) \quad (4)$$

If α (the gain of amplifier 3) is chosen such that $\alpha=\alpha_o$ by selecting the area of transistor Q6 as described hereinbefore, then $$V_2-V_1=(\alpha-1)Vth \quad (4A)$$

allowing an output voltage Vout to be obtained on the output U which is equal to the desired threshold voltage Vth via amplifier 4 with a gain 1/(1−α).

One useful design feature is that both transistors M1 and M2 have the source connected to the reference potential 5, i.e. to ground, which prevents the so-called "body" effect from occurring.

When the second-order effects due to the mobility of the carriers, as brought about by the overdrive effect, and to the channel length modulation brought about by Vds (and parameters), are considered, the error percent in obtaining the threshold voltage Vth can be estimated.

Taking the two currents flowing through transistors M1 and M2 as identical with each other and resolving equation (1), equation (3) for the overdrive voltage may be re-stated as follows:

$$Vov_1=\alpha Vov_2+(½)(Q-K)(\alpha-1)Vov_2^2 \quad (5)$$

Therefore, equation (4A), considering second-order effects, becomes:

$$V_2-V_1=(\alpha-1)[Vth+(½)(Q-K)Vov_2^2] \quad (6)$$

The term in square brackets is the error due to mobility and channel length modulation. Accordingly, the error percent E% of the error in determining the threshold voltage is given by:

$$E\% = 100(1/2)(Q-K)(Vgs_2-Vth)^2/Vth \qquad (7)$$

which can be made smaller than 0.5%.

Referring to the example of FIG. 2, the network comprising the first cell and transistor M1 carries out the voltage-to-current conversion of the threshold voltage plus the overdrive voltage of the first MOS transistor M1 as described below. Likewise, the second cell and second MOS transistor M2 carry out the voltage-to-current conversion of $Vth+Vov_2$. The provision of the current-mirrors 6 and 7 ensures both high accuracy and high output impedance.

Through the legs of the first cell Q1a,Q1b, a current $I1=Vgs_1/R$ will flow, and a current $I2=Vgs_2/R$ will flow through the legs of the second cell Q3a,Q3b. Transistor Q5 mirrors current I1 exactly, whilst transistor Q6 mirrors a current α I2, due to its dimensions as described hereinbefore.

As a result, the output resistor Rout connected in series with transistors QD1 and QD2 will have a current Iout flowing therethrough which is given by:

$$Iout = \alpha I2 - I1 = (1/R)(\alpha Vgs_2 - Vgs_1) = Vth(\alpha - 1)/R \qquad (8)$$

Thus, by selecting an output resistance Rout with a value of $R/(\alpha-1)$, Vout can be accurately made equal to Vth. The voltage generator of this invention has shown to be well capable of operating at room temperature with an error below 2% for each value of the voltage supply in excess of 3.5 Volts.

It is a further advantage of this device that it has reduced vulnerability, to the so-called "body" effect over prior art devices.

We claim:

1. A threshold voltage generator for a field-effect transistor being of a type effective to compensate for variations in the threshold voltage from a nominal value and characterized in that it comprises:

a first amplifier having a first input connected to a first current generator;

a second amplifier having an output connected to a second input of the first amplifier and having an input connected to a second current generator; and a third amplifier having an input connected to receive an output from the first amplifier and having an output adapted to produce the nominal value of said threshold voltage.

2. A voltage generator according to claim 1, further including a first transistor connected between the first input of the first amplifier and a reference potential and a second transistor connected between the input of the second amplifier and the reference potential.

3. A voltage generator according to claim 2, characterized in that said first and second transistors are field-effect transistors.

4. A voltage generator according to claim 2, characterized in that said transistors are arranged in a diode configuration.

5. A current generator according to claim 1, characterized in that said second amplifier has a gain whose value is given by a predetermined α parameter, and said third amplifier has a gain which is defined by a $1/(\alpha-1)$ ratio.

6. A voltage generator according to claim 5, wherein the first input of the first amplifier and the input of the second amplifier are connected to a reference potential through respective field effect transistors each having a channel region, said α parameter being related to the dimensions of the channel regions of said field effect transistors in accordance with the relation: $(W/L)_2 = \alpha^2(W/L)_1$, where $(W/L)_2$ and $(W/L)_1$ are the ratios of the width and length of the channel regions of the second and first transistors, respectively.

7. A voltage generator according to claim 1, characterized in that said second amplifier comprises a bipolar transistor.

8. A device for supplying a selected threshold voltage comprising:

a first reference input signal generator for producing a first reference input signal;

a second reference input signal generator for producing a second reference input signal, each of the first and second reference input signals being applied to a respective differential input of a differential amplifier;

a threshold voltage output amplifier receiving at its input the output of the differential amplifier and having a gain selected to provide at its output the threshold voltage; and an initial amplifier stage having a gain of α, receiving at its input the second reference input signal and having its output connected to the input of the differential amplifier so that the second reference input signal is applied to the differential amplifier through the initial amplifier having a gain of α.

9. The device of claim 8 wherein each reference input signal generator comprises:

a transistor connected in a diode configuration, each diode configuration having a reference terminal and an input terminal; and an input current source having a reference current output, said reference current output being input to the transistor at its input terminal.

10. The device of claim 9 wherein the transistors are field effect transistors.

11. The device according to claim 9 wherein each of the transistors has its source connected to the body of the substrate to prevent a body effect from occurring.

12. The device of claim 8 wherein the first reference signal input generator includes a first transistor and a second reference signal generator includes a second transistors, and wherein the square of the gain of the initial amplifier stage is selected to be substantially equal to the width-to-length ratio of the first transistor divided by the width-to-length ratio of the transistor.

13. The device of claim 8, further including a third amplifier, wherein the output of the differential amplifier is connected to an input of the third amplifier, the third amplifier having a gain selected to produce the threshold voltage at a third amplifier output.

14. The device of claim 13 wherein the third amplifier has a gain of $1/(1-\alpha)$.

15. A device for generating a threshold voltage comprising:

a first input reference voltage source, including a first reference transistor having a first threshold voltage and a first overdrive voltage, said input reference voltage source generating a first reference voltage equal to the sum of the first threshold voltage and the first overdrive voltage;

a second input reference voltage source generating a second reference voltage equal to the first reference voltage multiplied by a proportionality constant;

a first amplifier having a gain equal to the proportionality constant, the first amplifier receiving the second input reference voltage from the second input reference source at a first amplifier input terminal and producing a first amplifier output signal in response thereto; and a comparing amplifier having a first input terminal, a second input terminal and a comparing output terminal, said comparing amplifier receiving the first reference voltage from the first input reference voltage source at the first input terminal, said comparing amplifier receiving the first amplifier output signal at the second input terminal, the comparing amplifier producing a compared voltage at the comparing output terminal responsive to the voltages at the first input terminal and the second input terminal.

16. The device of claim 15, further including a compensating output amplifier having a compensating input terminal and a compensating output terminal, the compensating output amplifier receiving the comparing output signal at the compensating input terminal and providing the threshold voltage at the compensating output terminal.

* * * * *

UNITED STATES PATENT AND TRADEMARK OFFICE
CERTIFICATE OF CORRECTION

PATENT NO. : 5,495,166
DATED : February 27, 1996
INVENTOR(S) : Roberto Alini, et. al.

It is certified that error appears in the above-indentified patent and that said Letters Patent is hereby corrected as shown below:

In column 6, claim 12, line 38, please delete "transistors" and insert therefor--transistor--.

Signed and Sealed this

Fourth Day of June, 1996

Attest:

BRUCE LEHMAN

*Attesting Officer*       *Commissioner of Patents and Trademarks*